United States Patent
Petros et al.

(10) Patent No.: US 11,251,582 B2
(45) Date of Patent: Feb. 15, 2022

(54) FREQUENCY AGILE OFFSET LOCKED CONTINUOUS WAVE LASER

(71) Applicant: UNITED STATES OF AMERICA AS REPRESENTED BY THE ADMINISTRATOR OF NASA, Washington, DC (US)

(72) Inventors: Mulugeta Petros, Newport News, VA (US); Tamer Refaat, Hampton, VA (US); Upendra N. Singh, Yorktown, VA (US); Charles W. Antill, Hampton, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 330 days.

(21) Appl. No.: 16/280,628

(22) Filed: Feb. 20, 2019

(65) Prior Publication Data
US 2019/0260177 A1    Aug. 22, 2019

Related U.S. Application Data

(60) Provisional application No. 62/633,717, filed on Feb. 22, 2018.

(51) Int. Cl.
*H01S 5/0687* (2006.01)
*H01S 3/11* (2006.01)
(Continued)

(52) U.S. Cl.
CPC .......... *H01S 5/0687* (2013.01); *H01S 3/1003* (2013.01); *H01S 3/108* (2013.01);
(Continued)

(58) Field of Classification Search
CPC .. H01S 5/0687; H01S 3/10092; H01S 3/1303; H01S 3/1003; H01S 3/10015;
(Continued)

(56) References Cited

U.S. PATENT DOCUMENTS

2006/0268950 A1    11/2006 Kane
2008/0267241 A1    10/2008 Brown et al.
(Continued)

OTHER PUBLICATIONS

Refaat et al., "Wavelength locking to CO2 absorption line-center for 2-μm pulsed IPDA lidar application", Proceedings of SPIE 9879, (May 4, 2016) 987804. DOI: 10.1117/12.2296213 (Year: 2016).*
(Continued)

*Primary Examiner* — Xinning(Tom) Niu
(74) *Attorney, Agent, or Firm* — Shawn P. Gorman; Jonathan B. Soike; Helen M. Galus (57) ABSTRACT

Aspects of the present disclosure are directed to methods and apparatuses for generating laser light. As may be implemented in accordance with one or more embodiments, laser light is generated at a laser light source and is modulated in response to a frequency modulation signal, to generate a plurality of different wavelengths of laser light. The frequency modulation signal is generated, for each particular one of the wavelengths of laser light, at a respective seeding frequency corresponding to the particular one of the wavelengths in which the seeding frequency is different for each of the different wavelengths. Such an approach may, for example, involve generating the frequency modulation signal with a frequency generator circuit and using the frequency modulation signal to control an electro-optical modulator for modulating the wavelength of the laser light.

20 Claims, 7 Drawing Sheets

(51) Int. Cl.
   *H01S 3/108*   (2006.01)
   *H01S 3/117*   (2006.01)
   *H01S 3/10*    (2006.01)
   *H01S 3/13*    (2006.01)
   *H01S 3/067*   (2006.01)
   *H01S 5/00*    (2006.01)
   *H01S 3/23*    (2006.01)

(52) U.S. Cl.
   CPC ...... *H01S 3/10015* (2013.01); *H01S 3/10092* (2013.01); *H01S 3/1106* (2013.01); *H01S 3/117* (2013.01); *H01S 3/1303* (2013.01); *H01S 3/06754* (2013.01); *H01S 3/2375* (2013.01); *H01S 5/0085* (2013.01)

(58) Field of Classification Search
   CPC ........ H01S 3/1106; H01S 3/108; H01S 3/117; H01S 3/06754; H01S 5/0085; H01S 3/2375
   See application file for complete search history.

(56) References Cited

U.S. PATENT DOCUMENTS

2010/0046950 A1   2/2010   Cao et al.
2013/0228688 A1*  9/2013   Plusquellic ............... G01J 3/26
                                                          250/339.06

OTHER PUBLICATIONS

Refaat et al., "Evaluation of an airborne triple-pulsed 2 μm IPDA lidar for simultaneous and independent atmospheric water vapor and carbon dioxide measurements," Applied Optics, (Feb. 20, 2015) 54(6):1387-1398. doi: 10.1364/AO.54.001387.

Refaat et al., "Wavelength locking to CO2 absorption line-center for 2□m pulsed IPDA lidar application," Proceedings of SPIE 9879, (May 4, 2016) 987904. DOI: 10.1117/12.2296219.

Petros et al., "Development of an Advanced Two-Micron Triple-Pulse IPDA Lidar for Carbon Dioxide and Water Vapor Measurements," 28th International Laser Radar Conference, 2017—Bucharest, Romania, (ILRC 28) (Apr. 13, 2018) EPJ Web of Conferences 176 [01009], EDP Sciences. https://doi.org/10.1051/epjconf/201817601009.

Singh et al., "Feasibility study of a space-based high pulse energy 2 μm CO2 IPDA lidar," Applied Optics, (Aug. 10, 2017) 56(23):6531-6547. doi: 10.1364/AO.56.006531.

* cited by examiner

FREQUENCY AGILE OFFSET LOCKED CONTINUOUS WAVE LASER

CROSS-REFERENCE TO RELATED PATENT APPLICATION(S)

This patent application claims the benefit of and priority to U.S. Provisional Patent Application Ser. No. 62/633,717, filed on Feb. 22, 2018, the contents of which are hereby incorporated by reference in their entirety.

STATEMENT REGARDING FEDERALLY SPONSORED RESEARCH OR DEVELOPMENT

The invention described herein was made by an employee/employees of the United States Government and may be manufactured and used by or for the Government of the United States of America for governmental purposes without the payment of any royalties thereon or therefore.

OVERVIEW

Lasers are useful for a multitude of applications. In many such applications, laser output radiation spectral linewidth control can be an important feature. For instance, scientific applications, such as atmospheric active remote sensing, can rely upon such features for accurate operation.

Certain high energy/power lasers may not readily produce spectrally narrow linewidth output. In order to achieve a high energy/power output radiation that matches spectroscopic features of desired measurement objectives, a continuous wave (CW) laser may be used to injection seed and control the wavelength of the high energy laser. However, injection-seeding a laser can be limited in application relative to the resulting output of the high energy/power laser.

The above and other issues can be challenging to the design, manufacture and implementation of various lasers and laser applications.

BRIEF SUMMARY

The present disclosure is directed to lasers, and in particular to seed lasers that produce multiple different wavelength outputs for respectively controlling a higher power/energy laser to produce different wavelength outputs.

One embodiment of the present disclosure is directed to an apparatus including a laser light source that generates laser light, an optical modulator circuit and a frequency generator circuit. The optical modulator circuit generates multiple different wavelengths of laser light by, for each wavelength of laser light to be generated, modulating the laser light from the laser light source in response to a frequency modulation signal. The frequency generator circuit generates, for each particular one of the wavelengths of laser light to be generated, the frequency modulation signal at a seeding frequency corresponding to the particular one of the wavelengths, and couples the frequency modulation signal to the optical modulator circuit. In various contexts, this approach facilitates the generation of a seeding laser output at multiple wavelengths (e.g., successive pulses at different wavelengths) by modulating the output of a single seeding laser source. Further, such modulation can be effected via the generation of a variable frequency output and/or several successive frequencies respectively set or tuned for generating seeding laser pulses as specific wavelengths. These aspects can be utilized for addressing challenges such as those noted hereinabove.

Another embodiment of the present disclosure is directed to an apparatus including a laser light source, beam splitter, optical wavelength locking circuit, electro-optical modulator and a frequency generator circuit. The laser light source has a laser diode and a laser driver circuit, that operate to generate laser light that is coupled to the beam splitter, which splits the received laser light into first and second laser light outputs. The optical wavelength locking circuit generates and provides a control input to the laser driver circuit for controlling the wavelength of the laser diode, based on the first laser light output from the beam splitter. The electro-optical modulator circuit generates and outputs multiple different wavelengths of laser light from the second laser light output of the beam splitter, by modulating, for each wavelength of laser light to be generated, the laser light from the laser light source in response to a frequency modulation signal. The frequency generator circuit generates, for each particular one of the wavelengths of laser light to be generated, a frequency modulation signal at a seeding frequency corresponding to the particular one of the wavelengths. This frequency modulation signal is coupled to the electro-optical modulator, therein controlling the electro-optical modulator to output successive pulses of seeding laser light at different wavelengths.

Yet another embodiment of the present disclosure is directed to a method for generating a seeding laser output. Laser light is generated at a laser light source and multiple different wavelengths thereof are then provided by, for each wavelength of laser light to be generated, modulating the laser light generated at the laser light source in response to a frequency modulation signal. The frequency modulation signal is generated for providing each particular one of the wavelengths of laser light at a seeding frequency corresponding to the particular one of the wavelengths. In this context, the seeding frequency may be different for each of the different wavelengths (e.g., successive pulses at different wavelengths).

These and other features, advantages, and objects of the present invention will be further understood and appreciated by those skilled in the art by reference to the following specification, claims, and appended drawings.

DETAILED DESCRIPTION

Figure 1:
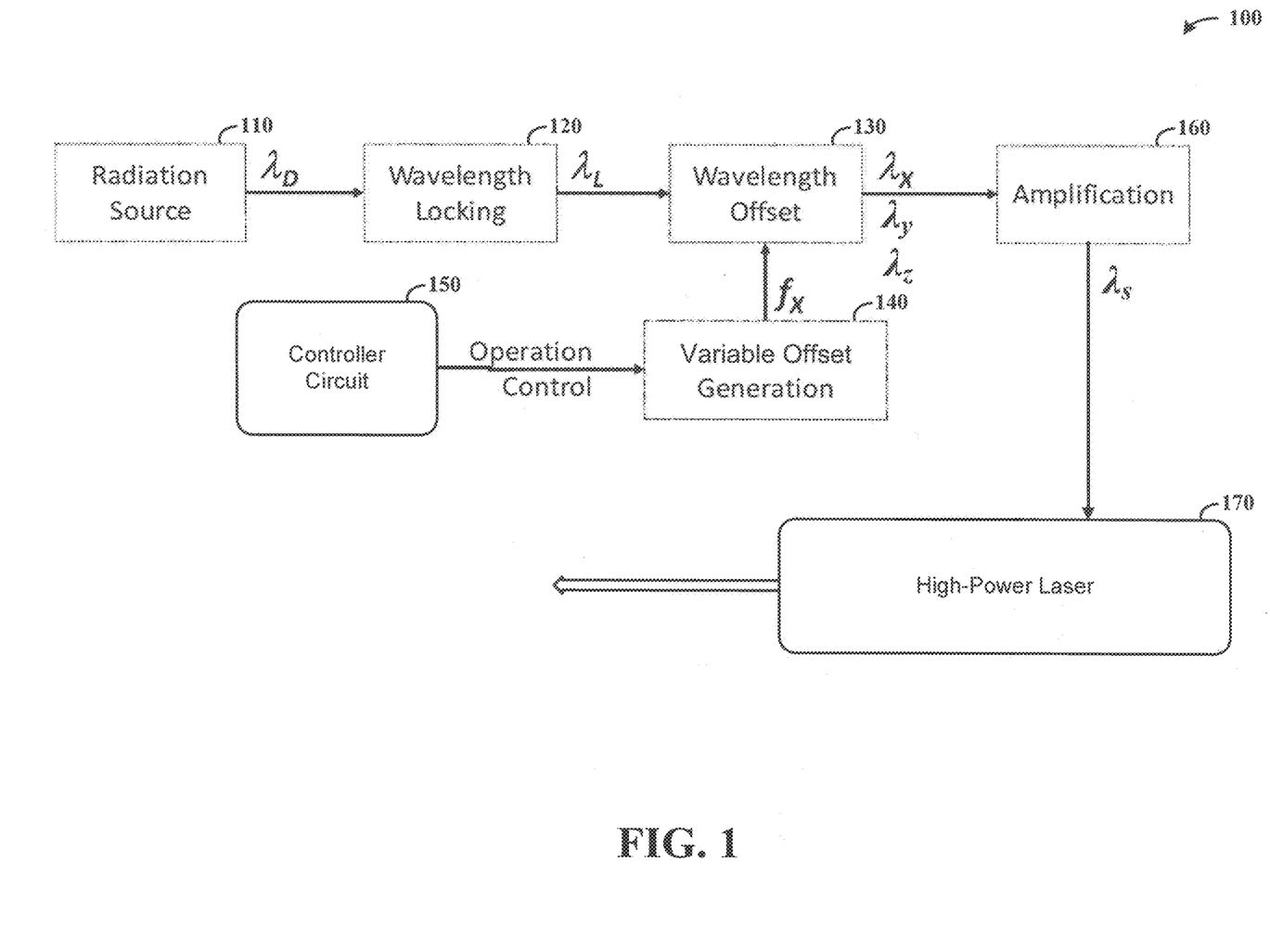
FIG. 1 shows a block diagram of an apparatus and scheme used for generating a laser source, such as for a seeding laser source, in accordance with one or more embodiments.

For purposes of description herein, the terms "upper," "lower," "right," "left," "rear," "front," "vertical," "horizontal," and derivatives thereof shall relate to the orientation shown in FIG. 1. However, it is to be understood that the contempated embodiments may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Various embodiments are directed to a laser, and related approaches, for producing multiple wavelengths. Such a laser may be utilized as a seeding laser. In various embodiments, a single laser diode (LD) is used to produce multiple wavelengths. Such lasers and related approaches may be used to address challenges such as those characterized above. For instance, a single LD can be used as a seeding laser to control a higher power/energy laser, such as for controlling laser output radiation spectral linewidth. This approach can be utilized to achieve high energy/power output radiation that matches spectroscopic features of desired measurement objectives. Such approaches can address challenges such as those characterized hereinabove, and mitigate the need to use multiple seed lasers and apply switches for selecting an appropriate wavelength.

In various embodiments, a fast tuning, frequency agile, low jitter, narrow line width, and single-frequency CW laser can be used to injection seed and control the wavelength of a high energy laser, by producing multiple wavelengths from a single LD. For instance, a tuning approach can be utilized to tune the output of the single LD to a variable wavelength and/or to a series of fixed wavelengths. This technique for generating seed laser source thus facilitates use of a low-power radiation source and electronics, with stable electronic frequency offset control, and can be implemented with fiber coupled optics to facilitate a compact, lightweight and low power consumption seeding architecture useful in a variety of applications, such as in airborne and space-borne applications.

In various implementations, a laser as characterized herein may be locked to a wavelength reference. For example, in atmospheric differential absorption lidar (DIAL) active remote sensing applications, a seed laser can be locked and referenced to a species of interest using gas cells. In this context the seed laser source can be locked to an absorption feature and the generated wavelength is used as a reference from which other offset wavelengths can be generated.

Various embodiments are directed to generating a CW laser source suitable for injection seeding high energy pulsed lasers at multiple wavelengths, which may be suitable for single and/or multi-pulsed lasers, such as those using a ramp and fire technique. In some implementations, the same seeding source is utilized for high power CW lasers. Switching of the seeding wavelength may be dynamic and rapidly achieved, while maintaining locking with respect to a wavelength reference. The seeding source may be implemented with a single output, and the output power can be adjusted to accommodate the high power laser requirements. Such an approach may utilize optical-fiber technology to achieve a compact, lightweight and low power consumption seed source architecture that is suitable for a variety of applications, such as airborne and space-borne applications.

In accordance with a particular embodiment, an apparatus includes a laser light source that generates laser light, an optical modulator circuit that modulates the wavelength of the generated laser light, and a frequency generator circuit that controls the optical modulator circuity by generating signals having respective frequencies and which are utilized by the optical modulator circuit for generating multiple different wavelengths of laser light. Specifically, for each wavelength of laser light to be generated, the laser light is modulated in response to a frequency modulation signal. In this manner, the frequency generator circuit may generate the frequency modulation signal at a seeding frequency corresponding to each particular one of the wavelengths to be provided. In this context, the frequency generator may provide a varied range of frequencies to suit particular applications. For instance, where a wide range of wavelengths is desired, multiple oscillators (or other frequency-generating circuitry) can be utilized to provide a broad range of frequencies (e.g., with switching between respective oscillators), and to in turn provide a broad range of wavelengths. Where a narrow range of frequencies is sufficient, fewer or a single oscillator can be used. In certain embodiments, the apparatus also includes an optical wavelength locking circuit that locks the wavelength of the laser light source by sampling an output of the laser light source and controlling the laser light source based on the sampled output (e.g., to mitigate wavelength deviation).

Consistent with the above, a seeding laser output can be provided at multiple wavelengths, such as to provide successive serial pulses at different wavelengths, by modulating the output of a single seeding laser source (e.g., a laser diode). The modulation can be controlled by generating a variable frequency output and/or multiple fixed frequency outputs respectively used to set or tune seeding laser pulses to specific wavelengths. In various embodiments, an apparatus includes a seeding laser having the laser light source, optical modulator circuit and frequency generator circuit noted above, as well as another (e.g., high-power) laser optically coupled to receive the output of the seeding laser. The respective seeding laser outputs can be used, for example, to set the wavelength of a higher-power laser. Further, such a higher-power laser output can be generated as serial laser pulses of different wavelengths, based on the respective seeding frequencies generated by the frequency generator circuit and utilized by the optical modulator circuit to generate the multiple different wavelengths of laser light. Successive ones of the serial laser pulses thus may have different wavelengths that may each be useful, for example, for analyzing different types of atmospheric components.

The optical modulator circuit can be implemented using one or more of a variety of approaches. In some embodiments, an electro-optical modulator operates with the frequency generator circuit to variably tune the wavelength of the laser light from the laser light source according to a variable seeding frequency generated by the frequency generator circuit. Such an electro-optical modulator may otherwise (or also) operate with the frequency generator circuit to tune the wavelength of the laser light from the laser light source to respective fixed wavelengths, according to respective seeding frequencies generated by the frequency generator circuit. Each seeding frequency corresponds to one of the respective fixed wavelengths. The optical modulator circuit can be implemented with a single output and to serially generate and output the respective different wavelengths via the single output. Utilizing the electrical frequency input, a single modulator can thus be used to generate multiple frequencies.

The frequency generator circuit can also be operated in a variety of manners, to suit particular embodiments. In some embodiments, the frequency generator circuit generates serial outputs having respective control frequencies, with each control frequency being set to cause the optical modulator circuit to produce a series of output laser light pulses having respective wavelengths set based on one of the respective control frequencies. In some embodiments, the frequency generator circuit includes switchable fixed frequency sources and outputs successive signals having different respective seeding frequencies by switching between different ones of the fixed frequency sources.

Another embodiment of the present disclosure is directed to an apparatus including a laser light source, beam splitter, optical wavelength locking circuit, electro-optical modulator and a frequency generator circuit. The laser light source has a laser diode and a laser driver circuit, that operate to generate laser light that is coupled to the beam splitter, which splits the received laser light into first and second laser light outputs. The optical wavelength locking circuit generates and provides a control input to the laser driver circuit for controlling the wavelength of the laser diode, based on the first laser light output from the beam splitter. The electro-optical modulator circuit generates and outputs multiple different wavelengths of laser light from the second laser light output of the beam splitter, by modulating, for each wavelength of laser light to be generated, the laser light from the laser light source in response to a frequency modulation signal. The frequency generator circuit generates, for each particular one of the wavelengths of laser light to be generated, a frequency modulation signal at a seeding frequency corresponding to the particular one of the wavelengths. This frequency modulation signal is coupled to the electro-optical modulator, therein controlling the electro-optical modulator to output successive pulses of seeding laser light at different wavelengths. In various implementations, the apparatus also includes a laser that utilizes seeding laser light output by the output of the electro-optical modulator circuit to generate serial laser pulses of different wavelengths and at a higher power than a power of the laser light output. These pulses are set/controlled based on the respective seeding frequencies generated by the frequency generator circuit and utilized by the electro-optical modulator circuit to generate the successive pulse of seeding laser light.

The frequency generator circuit can generate the frequency modulation signal in a variety of manners. In some embodiments, the frequency of the frequency modulation signal is variably tuned and used to control the electro-optical modulator circuit to modulate the second laser light output of the beam splitter for producing the successive pulses of seeding laser light. In other embodiments, the frequency modulation signal is generated at respective fixed frequencies and used to control the electro-optical modulator circuit to modulate the second laser light output of the beam splitter for producing the successive pulses of seeding laser light, at respectively-fixed wavelengths corresponding to each of the respective fixed frequencies. In certain implementations, the fixed frequencies are generated using a plurality of switchable fixed frequency sources that respectively output signals at one of the respective fixed frequencies.

As may be implemented in accordance with one or more embodiments, laser light is generated at a laser light source and is modulated in response to a frequency modulation signal, to generate multiple different wavelengths of laser light. The frequency modulation signal is generated, for each particular one of the wavelengths of laser light, at a respective seeding frequency corresponding to the particular one of the wavelengths in which the seeding frequency is different for each of the different wavelengths. In certain embodiments, the modulated laser light is then coupled to another laser and used to generate successive serial laser pulses of different wavelengths and at a higher power than a power of the modulated laser light. Each successive pulse exhibits a wavelength that is based on the respective seeding frequencies and a corresponding wavelength of the modulated laser light.

In some embodiments, the frequency modulation signal is variably tuned and used for generating each wavelength of laser light based on the value of the variably tuned frequency modulation signal. In other embodiments, the frequency modulation signal is generated in pulses at fixed frequencies, in which each wavelength of laser light is generated based on one of the fixed frequencies at which the respective pulses of the frequency modulation signal are generated.

Referring now to the Figures, FIG. 1 shows a block diagram of an apparatus and scheme 100 used for generating a laser source, such as for a seeding laser source, in accordance with one or more embodiments. A radiation source 110, such as a monochromatic radiation source (e.g., utilizing a low power LD) generates laser light having an operating wavelength, $\lambda_D$, which is within the same spectral region of a required seeding wavelength, $\lambda_S$. A wavelength locking component 120 locks the wavelength of the radiation source 110 to a precise value, $\lambda_L$, using a wavelength reference. A wavelength offset component 130 modulates the locked radiation according to a frequency input provided by a variable offset generation circuit 140 based on an operation control input provided by a controller circuit 150. One or more single wavelengths, $\lambda_x$, $\lambda_y$, or $\lambda_z$ (or more) is/are discriminated from these harmonics, such as by using active optical filtering. The output of the wavelength offset component 130 may then be amplified by an amplification circuit 160. In some implementations, the apparatus 100 further includes a high-power laser 170, which is coupled to receive the seeding output of the amplification circuit 160 and utilize the seeding output for providing a high-power laser output in accordance with the seeding wavelength, $\lambda_S$.

In a particular implementation, the wavelength offset implemented at 130 relies on an offset generation scheme implemented at 140 that defines the offset amount with respect to the wavelength reference. The offset generation scheme is based on electronics that generate any number of required seeding frequencies, N (e.g., $f_1, f_2, \ldots f_X \ldots f_N$). Any one of these frequencies can be selected and timed using a digital operation control command. The output of the wavelength offset component 130 is applied to an amplification scheme at 160 to condition the seeding power and accommodate for radiation transmission power loss through different optical components. The amplification scheme relies on an optical amplifier stage that is passive with respect to wavelength. Thus, the final generated seeding source at wavelength $\lambda_S$, meets the condition $\lambda_S = \lambda_X$. The amplification stage at 160 can compensate for optical fiber power loss as shown, or via placement of the amplification circuit 160 earlier in the process, such as after wavelength locking component 120.

Figure 2:
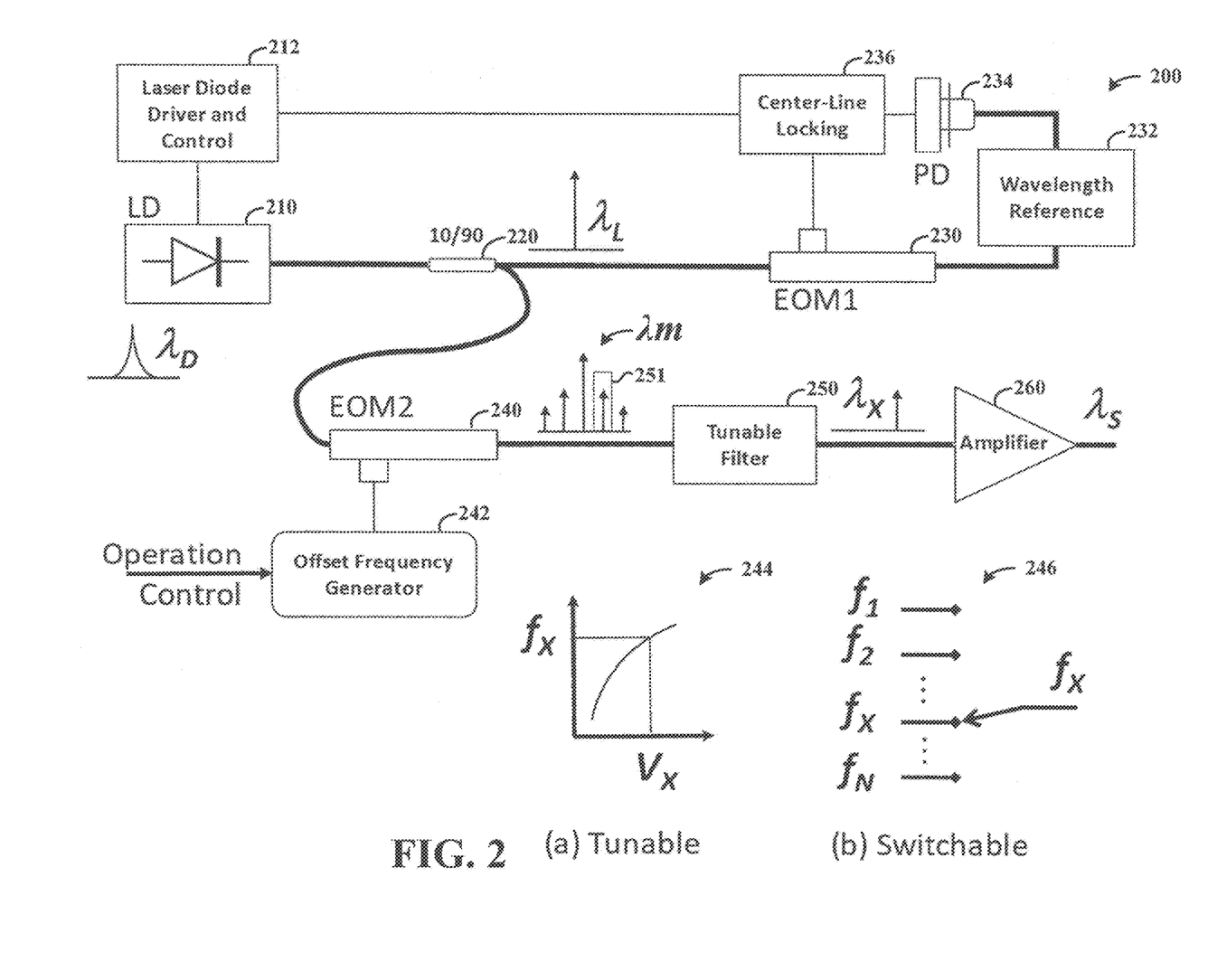
FIG. 2 shows a seeding laser apparatus, as may be implemented in accordance with one or more embodiments.

FIG. 2 shows a seeding laser apparatus 200, as may be implemented in accordance with one or more embodiments. Thin and thick lines represent electrical and optical fiber connections, respectively. A monochromatic LD 210, operating in a CW mode, is used as an initial source to generate and output laser light having a radiation wavelength and power that are functions of the LD's operating conditions in terms of bias current and temperature. The output of the LD 210 is coupled to a fiber beam splitter 220, which splits the radiation output and provides the first part of the split radiation for a wavelength locking scheme. Specifically, the wavelength locking scheme applies the input LD split radiation on to an electro-optical modulator (EOM) 230, the output of which is applied to a wavelength reference 232 component, such as a fiber coupled gas cell. The output radiation from the cell is monitored using a fiber coupled photo detector (PD) 234. A center-line locking controller 236 drives the EOM 230 based on an output of the PD 234, and further controls an LD driver and control circuit 212 to enhance operating conditions of the LD 210 for producing an output locked wavelength output. For instance, the LD driver and control circuit 212 may be used to precisely control the operating temperature (e.g., 1 mK) and current (e.g., 100 µA) of the LD 210.

Referring again to the beam splitter 220, a second part of the split radiation is provided to EOM 240, which modulates the radiation to effect wavelength offset. The EOM 240 modulates the received radiation, by frequency offset, as controlled by an offset frequency generator circuit 242 that applies signals at respective frequencies or variable frequency to the EOM 240. This results in a set of wavelengths, $\lambda_M$, being output from the EOM 240, which relate to a modulation frequency, $f_X$, used by the offset frequency generator circuit 242, by the relation $$\lambda_M = \lambda_L \pm m \cdot \frac{c}{f_X}$$

where m is an integer relating to the frequency harmonics and c is the speed of light. A tunable optical filter 250 is used to select a radiation wavelength, $\lambda_X$, out of the generated set of wavelengths, $\lambda_m$. By way of example, wavelength 251 of the set of wavelengths, $\lambda_m$, is shown as having been selected. The selected radiation may then be amplified at an amplifier 260, such as an optical amplifier, and can be applied as a seed source.

The modulation carried out by the offset frequency generator 242 can be provided in a variety of manners. For instance, electronic offset frequency generation can be achieved using a variable frequency source to produce variable frequencies, using a set of switchable fixed frequency sources, or using a combination thereof. In some embodiments, a variable frequency source such as voltage controlled oscillator is used to provide a continuous frequency and results in a voltage controlled wavelength tuning, as indicated at 244 in FIG. 2, inset (a). In certain example embodiments, a set of preselected fixed frequencies are generated such as by using different fixed frequency oscillators, and applied to a high-speed selector switch (within the offset frequency generator 242) that provides switched wavelength tuning as shown at 246 in FIG. 2, inset (b).

Accordingly, the seeding laser apparatus 200 can produce a single output CW radiation with a precisely locked wavelength, $\lambda_S$, which may be variably tuned and/or switchable between multiple tunable wavelengths (e.g., $\lambda_1, \lambda_2, \ldots \lambda_X \ldots \lambda_N$) that correspond to respective control frequencies (e.g., $f_1, f_2, \ldots f_X \ldots f_N$) generated at the offset frequency generator 242 and used to control the EOM 240. For high energy pulsed lasers, synchronization may be utilized to maintain a single-wavelength operation during Q-switch fire. In various embodiments, the wavelength of successive pulses is abruptly changed to seed each successive pulse with a different wavelength.

Figure 3:
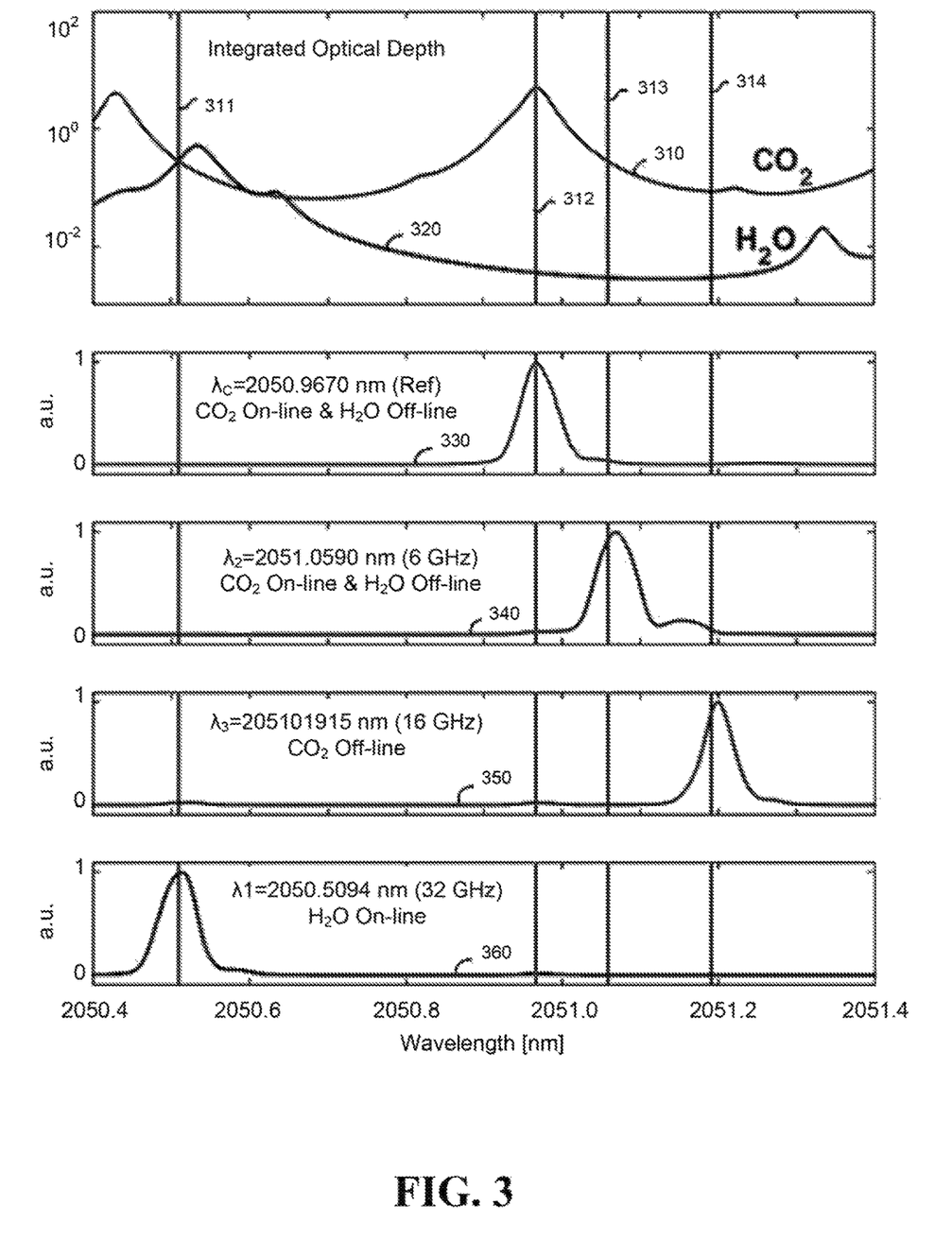
FIG. 3 shows respective plots that depict spectra as may be generated in accordance with one or more embodiments.

Referring now to FIG. 3, respective plots depict spectra as may be generated in accordance with one or more embodiments. Plots 310 and 320 respectively show $CO_2$ and $H_2O$ single-path integrated optical depth spectra, relative to integrated path differential absorption (IPDA) operating wavelengths that include $H_2O$ on-line (311, corresponding to plot 360), a $CO_2$ reference (312, corresponding to plot 330), $CO_2$ on line/$H_2O$ off line (313, corresponding to plot 340), and $CO_2$ off line (314, corresponding to plot 350). Wavelength locking is achieved in reference to the $CO_2$ R30 line (330).

The apparatuses and methods characterized herein may be utilized in a variety of applications. One such application involves an airborne lidar apparatus, which may utilize a 2-µm triple pulse IPDA to measure column content of atmospheric $H_2O$ and $CO_2$ simultaneously and independently. This is achieved by transmitting three successive high-energy pulses, seeded at three different wavelengths, through the atmosphere. The three pulses are emitted 200 µs apart and repeated at 50 Hz. The seeding wavelengths can be selected to mitigate measurement interference from one molecule to the other, such as with the wavelengths shown in plots 340, 350 and 360 in FIG. 3.

For general information regarding optical spectrum analyzer applications, and for specific information regarding such analyzers that may be utilized in accordance with one or more embodiments, reference may be made to M. Petros, T. Refaat, U. Singh, J. Yu, C. Antill, R. Remus, B. Taylor, T. Wong, K. Reithmaier, J. Lee, S. Ismail, and K. Davis, "Development of an advanced two-micron triple-pulse IPDA lidar for carbon dioxide and water vapor measurements," 28th International Laser Radar Conference (ILRC), Bucharest, Romania, 2017, which is fully incorporated herein by reference. For further information regarding sensing characteristics in space or in the atmosphere generally and specifically as may be implemented with one or more embodiments herein, reference may be made to U. Singh. T. Refaat, S. Ismail, K. Davis, S. Kawa, R. Menzies, and M. Petros, "Feasibility study of a space-based high pulse energy 2 µm CO2 IPDA lidar," Applied Optics, 56(23), 6531 (2017); and further to T. Refaat, U. Singh, J. Yu, M. Petros, S. Ismail, M. Kavaya, and K. Davis, "Evaluation of an airborne triple-pulsed 2 µm IPDA lidar for simultaneous and independent atmospheric water vapor and carbon dioxide measurements," Applied Optics, 54(6), 1387 (2015), both of which are also fully incorporated herein by reference.

Figure 4:
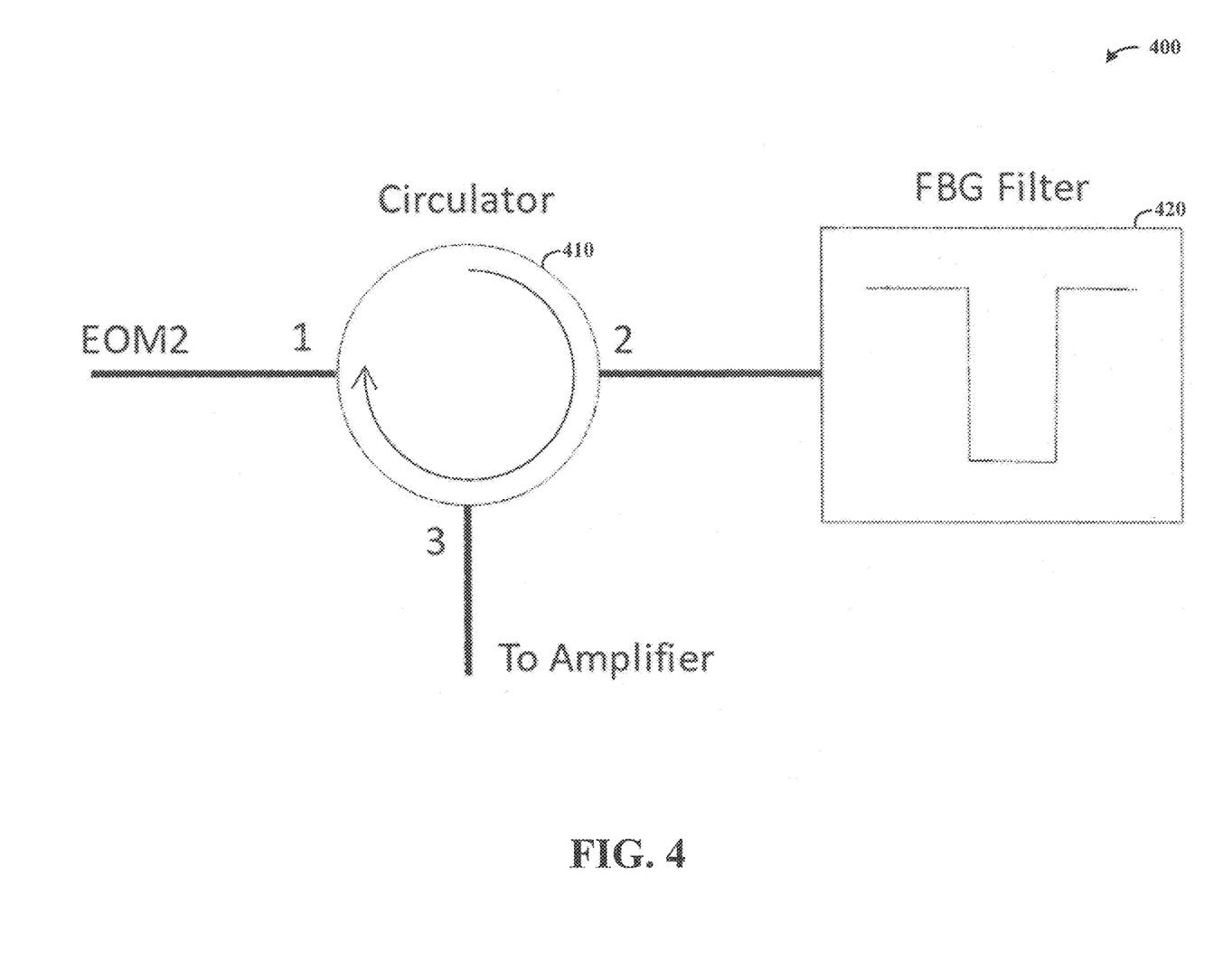
FIG. 4 shows an active tunable filter circuit, as may be implemented in accordance with one or more embodiments.

Referring now to FIG. 4, an active tunable filter circuit 400 is depicted, as may be implemented in accordance with one or more embodiments. The filter circuit 400 may, for example, be used for wavelength discrimination as characterized herein. An optical fiber circulator 410, which may be coupled to an EOM (e.g., 240), and a tuned fiber Bragg grating filter (FBG) 420 (e.g., 250), directs a filtered beam into a fiber optical amplifier (e.g., 260 as shown in FIG. 2). The filter output can be amplified and delivered to a pulsed laser as a seeding source. The amplifier gain can be set to match the output power to the seeding requirement of the pulsed laser.

Figure 5:
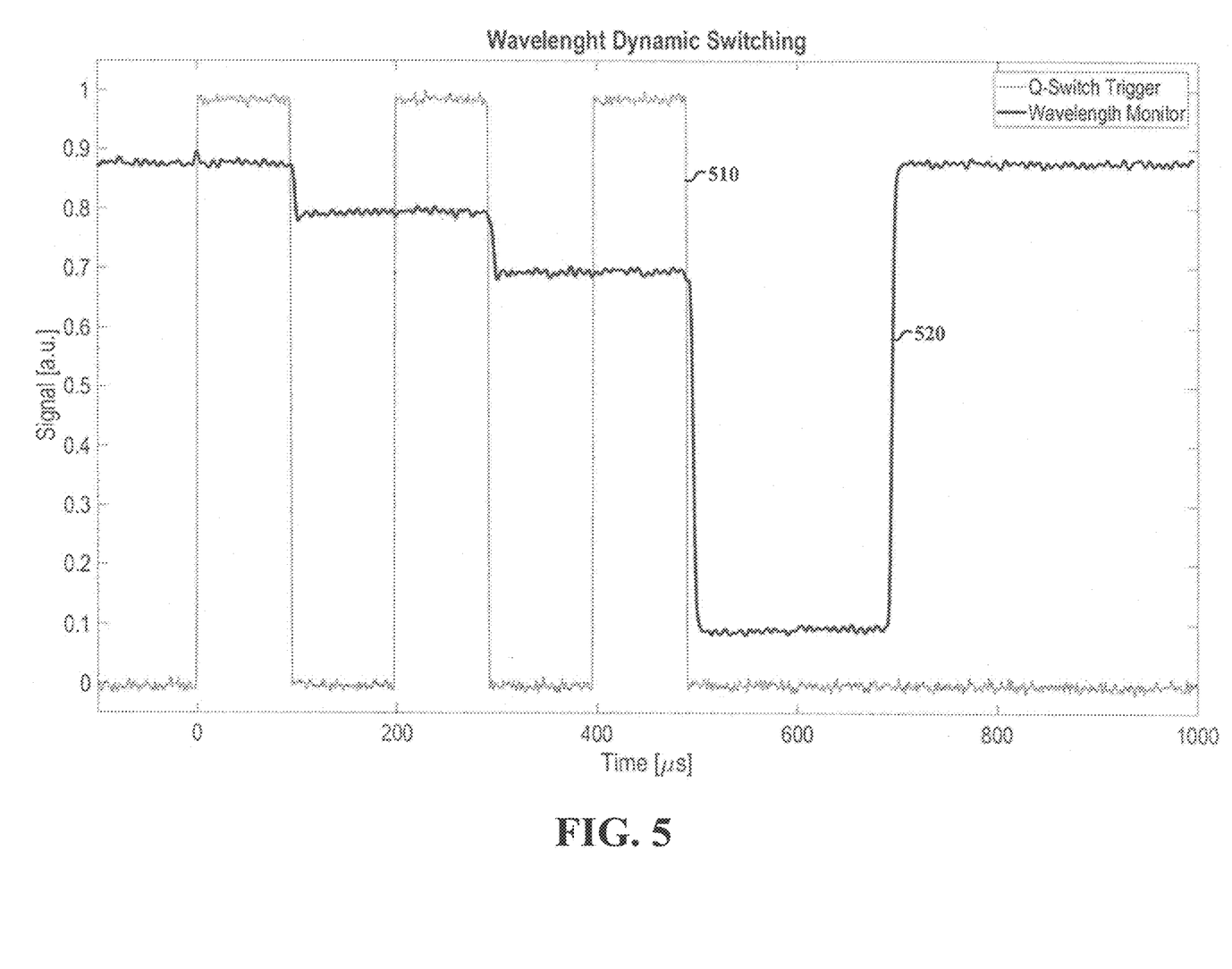
FIG. 5 shows plots of a pulsed laser Q-switch trigger signal and dynamic switching of a seed laser, as may be implemented in accordance with one or more embodiments.

FIG. 5 shows plots of a pulsed laser Q-switch trigger signal 510 and dynamic switching of a seed laser, which may be noted by a wavelength monitor 520. Such an approach can be implemented with triple-pulse seeding with a 32, 6 and 16 GHz sequence. Relative power deviation between the three wavelengths contribute to different signal levels indicated by the wavelength monitor. Synchronization between the seed and pulsed lasers can be utilized to insure steady-state seeding during the Q-switching event, with wavelength switching occurring at the end of the event.

Figure 6:
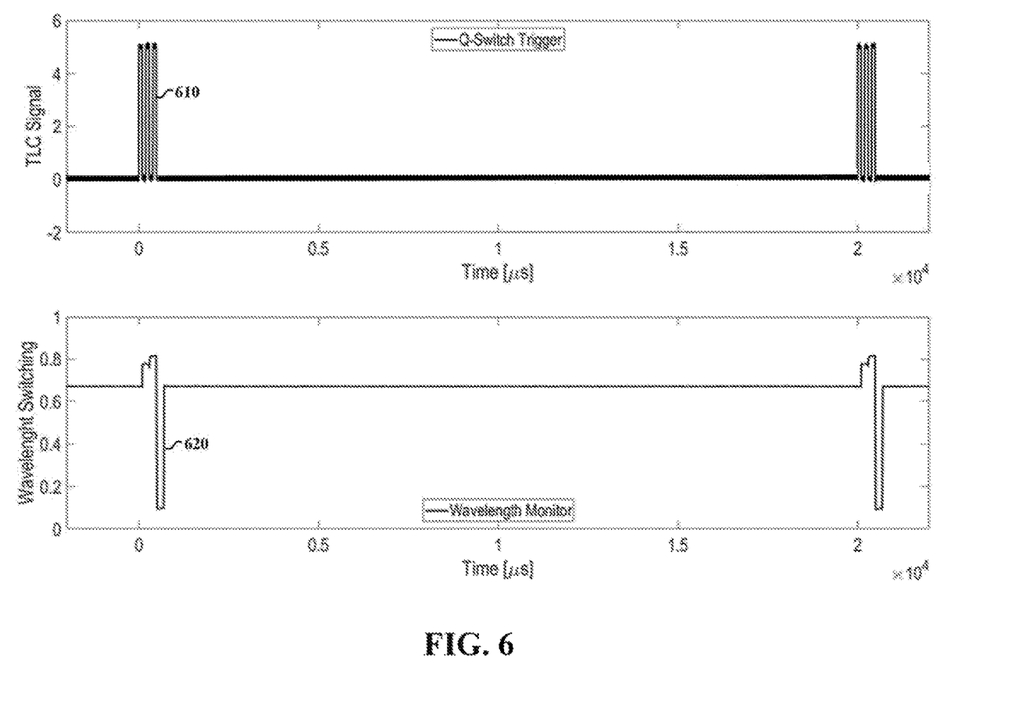
FIG. 6 shows plots of a pulsed laser Q-switch trigger signal and dynamic switching of a seed laser, as may be implemented in accordance with one or more embodiments.

FIG. 6 shows plots of a pulsed laser Q-switch trigger signal 610 and dynamic switching of a seed laser as recorded by a wavelength monitor at 620. Triple-pulse seeding can be set to 16, 6 and 32 GHz sequences, as in FIG. 5, and using longer time record and opposite seeding sequence of 16, 6 and 32 GHz to demonstrate the 50 Hz pattern repletion rate.

Figure 7:
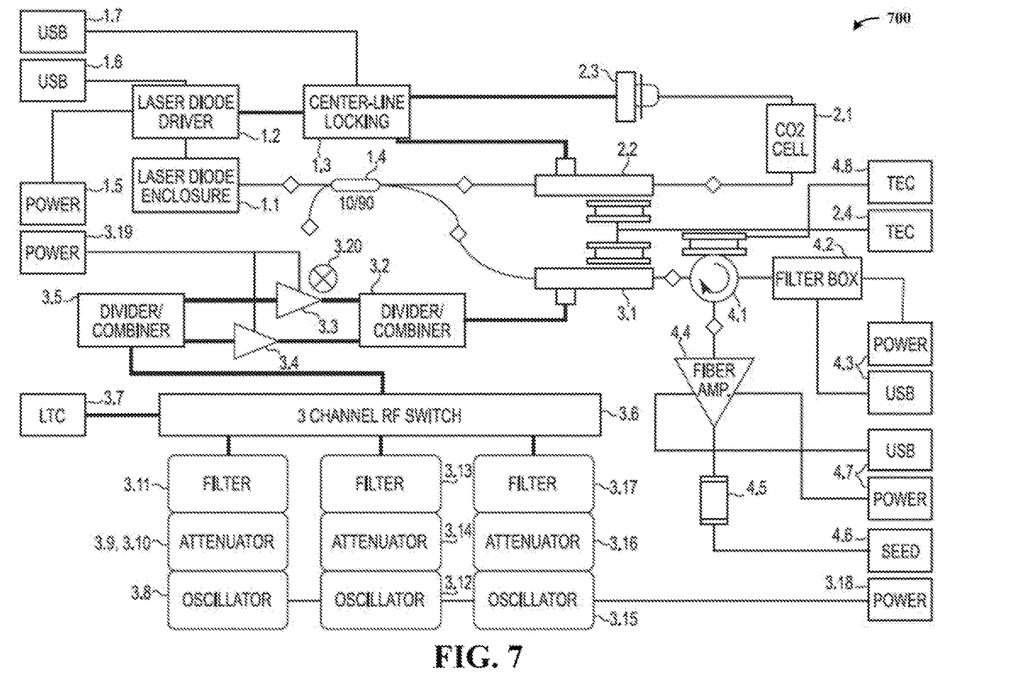
FIG. 7 shows a seeding (wavelength) control circuit, as may be implemented in accordance with one or more embodiments.

FIG. 7 shows a seeding (wavelength) control circuit 700, as may be implemented in accordance with one or more embodiments. The control circuit 700 may, for example, generate three or more different wavelengths using a single laser source at a single output, while relying on electronic switching (e.g., in lieu of optical switching). Such a control circuit may be utilized in accordance with one or more embodiments herein, such as shown in FIG. 2. Further, such a control circuit may be implemented with a 2-μm triple pulse IPDA lidar for simultaneous and independent measurement of atmospheric $CO_2$ and $H_2O$. The seeding control circuit generates different wavelengths at a seed output (4.6), which are toggled using RF switch (3.6).

By way of example, components for generating three different wavelengths are depicted and set using three oscillators (3.12, 3.15 and 3.8). This approach can be used for generating 6, 16 and 32 GHz offsets from the $CO_2$ R30 line center, monitored using a $CO_2$ absorption cell (2.1), and as may be consistent with FIG. 3. A fiber-coupled LD source (1.1) is used to generate 2-μm CW radiation that is applied to a 90/10 splitter (1.4). The 10% radiation (of the 90/10 splitter) is applied to EOM1 (2.2) operating at 200 MHz, the output of which is applied to a low-pressure $CO_2$ gas cell (2.1). A PD (2.3) detects the output of the gas cell (2.1) and feeds it to center-line locking electronics (1.3), which locks the laser wavelength via control of the LD driver 1.2. For instance, the laser wavelength may be locked by reducing an error signal generated by the modulated radiation difference. This may result in locking the radiation to the $CO_2$ R30 line center wavelength, $\lambda_c$, with ±650 kHz jitter (e.g., in accordance with FIG. 3). For general information regarding wavelength locking, and for specific information regarding approaches to wavelength locking that may be implemented herewith, reference may be made to T. Refaat, M. Petros, C. Antill, U. Singh, and J. Yu, "Wavelength locking to CO2 absorption line-center for 2-μm pulsed IPDA lidar application," Proceedings of SPIE, 9879, 987904 (2016), which is fully incorporated herein by reference.

The 90% output from the splitter (1.4) is applied to EOM2 (3.1) to generate three sensing wavelengths, $\lambda_1$, $\lambda_2$, and $\lambda_3$ (e.g., as shown in FIG. 3), and may implement frequency offset generation of about 32, 6 and 16 GHz, respectively. The offset frequencies may be generated by fixed frequency oscillators (3.12, 3.15, 3.8), each oscillator being followed by signal conditioning implemented by an amplifier/attenuator (3.9, 3.10, 3.14, 3.16) and a filter (3.11, 3.13, 3.17) circuitry to enhance the RF power to match EOM2 requirements. A fast, 3-channel RF electric switch (3.6) selects the frequency that corresponds to the wavelength for each pulse depending on an operation control input (3.7). The output from the switch (3.6) is provided to the EOM2 (3.1), and may be via respective divider/combiner circuitry (3.5, 3.3, 3.4, 3.2 and 3.20). Output radiation from the EOM2 (3.1) is applied via circulator 4.1 to an active tunable fiber filter (4.2) to further enhance the optical signal by eliminating cross talk and harmonics. This filter may be a tunable fiber Bragg grating (FBG) (4.2) filter that reflects back the selected wavelengths. The output from the circulator (4.1) is fed to amplifier 4.4 (and optionally 4.5) to provide a seeding output at 4.6. Various power or power/USB connections 1.5, 3.19, 4.3, 4.7 and 3.18 can be implemented as shown, as well as USB connections 1.6 and 1.7.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., controller circuit, variable offset generation circuit, or LD driver/control circuit). For example, in certain of the above-discussed embodiments, one or more modules are discrete logic circuits or programmable logic circuits configured and arranged for implementing these operations/activities, as in the circuit modules shown in FIGS. 1 and 2. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, multiple additional wavelengths can be generated using additional frequency generators. Further, applications depicted as seeding applications can be used for various other uses. Such modifications do not depart from the true spirit and scope of various aspects of the invention, including aspects set forth in the claims.

What is claimed is:

1. An apparatus comprising:
a laser light source configured and arranged to generate laser light;
an optical modulator circuit configured and arranged to generate a plurality of different wavelengths of laser light comprising modulating the laser light from the laser light source in response to a frequency modulation signal; and
a frequency generator circuit configured and arranged to:
generate the frequency modulation signal according to a seeding frequency from a set of seeding frequencies, wherein each seeding frequency corresponds to a particular one of the wavelengths from the plurality of different wavelengths; and
transmit the frequency modulation signal to the optical modulator circuit.

2. The apparatus of claim 1,
wherein the laser light source, optical modulator circuit and frequency generator circuit are components of a seeding laser configured and arranged to generate seeding laser light outputs as the output of the optical modulator circuit, further including a second laser optically coupled to the seeding laser for receiving the seeding laser light outputs at the respective wavelengths, and to generate a higher-power laser output based on the seeding laser light outputs.

3. The apparatus of claim 2, wherein the second laser is configured and arranged with the seeding laser to generate the higher-power laser output as serial laser pulses of different wavelengths, based on the respective seeding frequencies generated by the frequency generator circuit and utilized by the optical modulator circuit to generate the plurality of different wavelengths of laser light.

4. The apparatus of claim 3, wherein the second laser is configured and arranged with the seeding laser to generate the serial laser pulses of different wavelengths by generating a plurality of successive ones of the serial laser pulses in which each successive pulse has a wavelength that is different than a wavelength of an immediately previous pulse.

5. The apparatus of claim 1, wherein the optical modulator circuit includes an electro-optical modulator configured and arranged with the frequency generator circuit to variably tune the wavelength of the laser light from the laser light source according to a variable seeding frequency generated by the frequency generator circuit.

6. The apparatus of claim 1, wherein the optical modulator circuit includes an electro-optical modulator configured and arranged with the frequency generator circuit to tune the wavelength of the laser light from the laser light source to respective fixed wavelengths according to respective seeding frequencies generated by the frequency generator circuit, each seeding frequency corresponding to one of the respective fixed wavelengths.

7. The apparatus of claim 1, wherein the optical modulator circuit has a single output and is configured and arranged with the frequency generator circuit to serially generate and output the respective different wavelengths via the single output.

8. The apparatus of claim 1, wherein the optical modulator circuit is configured and arranged with the frequency generator circuit to serially generate and output the respective different wavelengths.

9. The apparatus of claim 1, wherein the optical modulator circuit is configured and arranged with the frequency generator circuit to serially generate and output the respective different wavelengths by operating the frequency generator circuit to generate serial outputs having respective control frequencies, each control frequency being set to cause the optical modulator circuit to produce a series of output laser light pulses, each output laser light pulses having a wavelength set based on one of the respective control frequencies.

10. The apparatus of claim 1, wherein the frequency generator circuit includes a plurality of switchable fixed frequency sources and is configured and arranged to output successive signals having different respective seeding frequencies by switching between different ones of the fixed frequency sources.

11. The apparatus of claim 1, further including an optical wavelength locking circuit configured and arranged to lock the wavelength of the laser light source by sampling an output of the laser light source and controlling the laser light source based on the sampled output.

12. An apparatus comprising:
a laser light source having a laser diode and a laser driver circuit, the laser light source being configured and arranged to generate laser light;
a beam splitter coupled to receive the laser light generated by the laser light source and configured and arranged to split the received laser light into first and second laser light outputs;
an optical wavelength locking circuit configured and arranged to generate and provide a control input to the laser driver circuit for controlling the wavelength of the laser diode, based on the first laser light output from the beam splitter;
an electro-optical modulator circuit configured and arranged to generate and output a plurality of different wavelengths of laser light from the second laser light output of the beam splitter comprising modulating the laser light from the laser light source in response to a frequency modulation signal; and
a frequency generator circuit configured and arranged to:
generate the frequency modulation signal according to a seeding frequency from a set of seeding frequencies, wherein each seeding frequency corresponds to a particular one of the wavelengths from the plurality of different wavelengths; and
transmit the frequency modulation signal to the electro-optical modulator, therein controlling the electro-optical modulator to output successive pulses of seeding laser light at different wavelengths.

13. The apparatus of claim 12, further including a laser optically coupled to receive the laser light output by the output of the electro-optical modulator circuit, and to generate serial laser pulses of different wavelengths and at a higher power than a power of the laser light output, based on the respective seeding frequencies generated by the frequency generator circuit and utilized by the electro-optical modulator circuit to generate the successive pulse of seeding laser light.

14. The apparatus of claim 12, wherein the frequency generator circuit is configured and arranged to variably tune the frequency of the frequency modulation signal and to control the electro-optical modulator circuit to modulate the second laser light output of the beam splitter for producing the successive pulses of seeding laser light using the variably tuned frequency.

15. The apparatus of claim 12, wherein the frequency generator circuit is configured and arranged to generate the frequency modulation signal at respective fixed frequencies, and to control the electro-optical modulator circuit to modulate the second laser light output of the beam splitter for producing the successive pulses of seeding laser light using each of the respective fixed frequencies to generate the successive pulses at respectively-fixed wavelengths.

16. The apparatus of claim 12, wherein the frequency generator circuit includes a plurality of switchable fixed frequency sources respectively configured and arranged to output signals at one of the respective fixed frequencies.

17. A method comprising:
generating laser light at a laser light source;
generating a plurality of different wavelengths of laser light comprising modulating the laser light generated at the laser light source in response to a frequency modulation signal; and
for each particular one of the wavelengths of laser light of the plurality, generating the frequency modulation signal at a according to a seeding frequency from a set of different seeding frequencies, wherein each seeding frequency corresponds to the particular one of the wavelengths.

18. The method of claim 17, further including optically coupling the modulated laser light to a laser and using the modulated laser light to generate successive serial laser pulses of different wavelengths and at a higher power than a power of the modulated laser light, based on the respective seeding frequencies and a corresponding wavelength of the modulated laser light.

19. The method of claim 17, wherein:
generating the frequency modulation signal includes variably tuning the frequency modulation signal; and
generating the plurality of different wavelengths of laser light includes generating each wavelength of laser light based on the variably tuned frequency modulation signal.

20. The method of claim 17, wherein the
generating the frequency modulation signal includes generating respective pulses of the frequency modulation signal at fixed frequencies; and
generating the plurality of different wavelengths of laser light includes generating each wavelength of laser light based on one of the fixed frequencies at which the respective pulses of the frequency modulation signal are generated.

\* \* \* \* \*